US008669785B2

(12) United States Patent
Pickett

(10) Patent No.: US 8,669,785 B2
(45) Date of Patent: Mar. 11, 2014

(54) LOGIC CIRCUITS USING NEURISTORS

(75) Inventor: Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 13/563,167

(22) Filed: Jul. 31, 2012

(65) Prior Publication Data

US 2014/0035614 A1 Feb. 6, 2014

(51) Int. Cl.
*H03K 19/02* (2006.01)

(52) U.S. Cl.
USPC .............................. 326/135; 326/104; 706/33

(58) Field of Classification Search
USPC .......................... 706/33, 38, 41–43
See application file for complete search history.

(56) References Cited

U.S. PATENT DOCUMENTS

| | | | |
|---|---|---|---|
| 5,489,786 A | 2/1996 | Chow et al. | |
| 5,773,996 A | 6/1998 | Takao | |
| 6,316,965 B1 | 11/2001 | Jonker et al. | |
| 7,791,376 B2 | 9/2010 | Lim et al. | |
| 7,978,506 B2 | 7/2011 | Lowrey | |
| 7,995,380 B2 | 8/2011 | Liu | |
| 8,525,553 B1 * | 9/2013 | Yi et al. | 326/135 |
| 2012/0011093 A1 * | 1/2012 | Aparin et al. | 706/33 |
| 2013/0099187 A1 * | 4/2013 | Pickett et al. | 257/2 |
| 2013/0173516 A1 * | 7/2013 | Rajendran et al. | 706/33 |

FOREIGN PATENT DOCUMENTS

JP 10276082 10/1998

OTHER PUBLICATIONS

Berezowski, K.S.; Compact Binary Logic Circuits Design Using Negative Differential Resistance Devices; http://ieeexplore.ieee.org/xpl/freeabs_all.jsp?arnumber=1673025 > On pp. 902-903; vol. 42; Issue: 16 ; Aug. 3, 2006.
Liang, D.S. et al; Deisgn of AND and NAND Logic Gate Using NDR Based Circuit Suitable for CMOS Process; http://ieeexplore.ieee.org/xpl/freeabs_all.jsp?arnumber=4145645 > On pp. 1325-1328; Dec. 2006.
Wilamowski, Bogdan Maciej; A Novel Concept of Neuristor Logic; Institute of Electronic Technology, Gdansk Technical University; Gdansk, Poland; Sep. 10, 1971.

* cited by examiner

*Primary Examiner* — Jany Richardson
(74) *Attorney, Agent, or Firm* — Robert M. Brush

(57) ABSTRACT

Logic circuits using neuristors is described. In an example, a circuit includes a plurality of neuristors each producing an output voltage spike in response to a super-threshold input voltage. A plurality of impedances couple the plurality of neuristors to form at least one input and an output, the output selectively providing an output voltage spike based on a logical operation of at least one input voltage at the at least one input.

15 Claims, 5 Drawing Sheets

LOGIC CIRCUITS USING NEURISTORS

BACKGROUND

Electrical logic operations are the building blocks of digital circuits. Aside from transistors, there are a number of device technologies that are able to perform logic operations including diodes, resistors, relays, and vacuum tubes. None of these technologies, however, have practical applications in integrated circuits (ICs) due to limitations in scaling and fabrication and/or the ability to perform signal gain. Thus, the transistor is the device typically used in digital circuits for performing logic operations, particularly when fabricated as complementary metal oxide semiconductor (CMOS) circuitry on an IC. CMOS logic, however, is approaching limits in terms of scaling and energy efficiency.

BRIEF DESCRIPTION OF THE DRAWINGS

Some embodiments of the invention are described with respect to the following figures.

DETAILED DESCRIPTION

Figure 1:
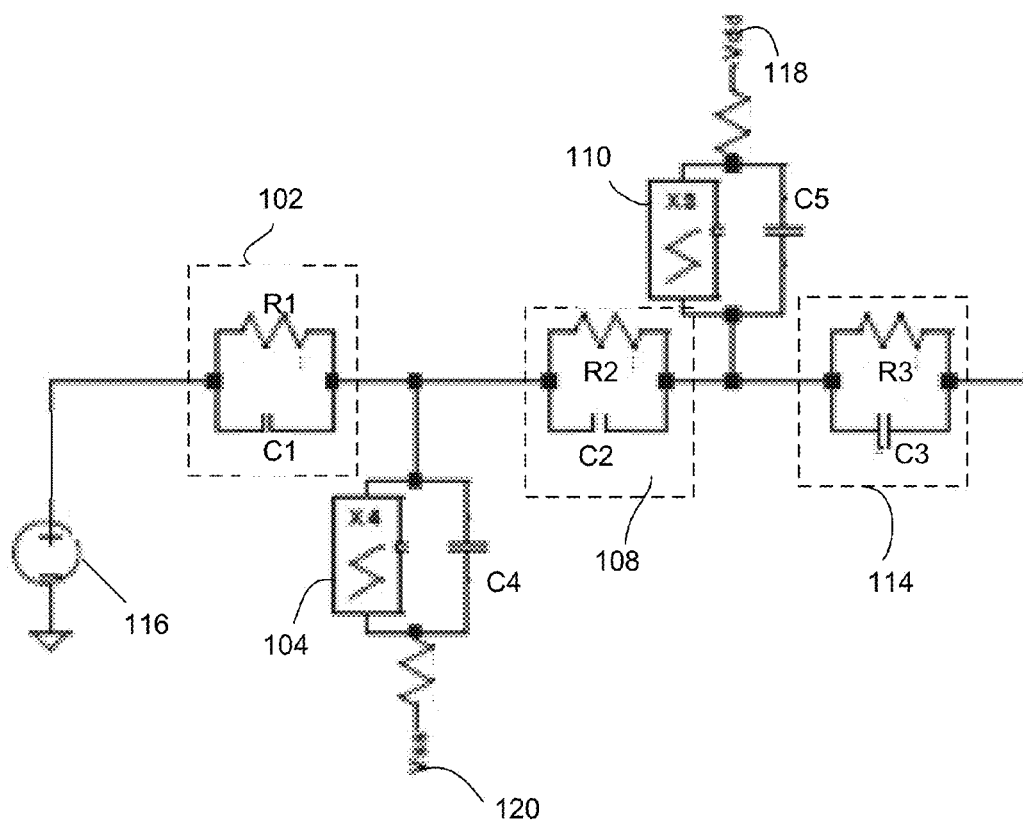
FIG. 1 is a circuit diagram showing a neuristor according to an example implementation.

Considerable research effort is being expended to develop electronic logic networks that mimic the human brain. The ideal building blocks of an electronic logic networks are components that can emulate the properties of neurons. Research is focused on developing a neuristor, an electronic component that processes signals in a manner that models the behavior of neurons. Desirable properties of neurons include thresholding, pulse shaping, and a refractory period. Thresholding refers to an activation threshold for a neuron before it fires a pulse to transmit a signal. Pulse-shaping refers to the ability of a neuron to regenerate the shape of the transmitting pulses, and thus prevent attenuation and dispersal of pulses traveling throughout the transmission. The refractory period is the time during which it is difficult or impossible to initiate a subsequent action potential on a neuron after it has been fired. Thus, pulses can be transmitted through the neuron if the incoming pulses are widely separated. Some incoming pulses are skipped and not transmitted if the time interval between them is shorter than the refractory period. An ideal neuristor should be able to exhibit these desirable properties.

Neuristors based on bipolar junction transistors and resonant tunneling diodes have been proposed. Bipolar junction transistors can be costly. Their manufacture generally requires full semiconductor processing. Additionally, since bipolar junction transistor manufacture is based on a silicon process, it is generally limited to two dimensions. Resonant tunneling diodes can be impractical. They require discrete inductors and thus cannot be integrated. Both of these technologies are hard-wired and do not provide a mechanism for dynamically alterable connections, a fact which limits their functionality.

Described herein are electronic devices that are configured to behave as an active nonlinear transmission line and, when combined in stages, perform logical operations. The electronic devices can be formed as multilayer structures that include a material that exhibits negative differential resistance. For example, the material can be a current driven insulator-metal phase transition material. The material can be a current-controlled negative differential resistance material. The multilayer structure acts as a type of neuristor. The behavior of the electronic devices described herein can be exploited to create circuits that perform logic operations and memory operations.

The electronic devices described herein are practical implementations of theoretical neuristors, since they can be produced by a thin-film back end process. This enables multiple stacks of the multilayer structures herein to be fabricated in an integrated circuit. Additionally, the thin-film nature of the multilayer structures allow for roll-to-roll type processing on flexible substrates. That is, multilayer structures do not require a semiconductor substrate. A thin-film process also allows for memristive devices to be fabricated as weighted connections between neuristors to provide new functionalities.

FIG. 1 is a circuit diagram showing a neuristor 100 according to an example implementation. The neuristor 100 includes an input impedance 102, a negative differential resistance (NDR) device 104, a coupling impedance 108, an NDR device 110, capacitors C4 and C5, and an output impedance 114. The input impedance 102 includes a resistor R1 in parallel with a capacitor C1, the coupling impedance 108 includes a resistor R2 in parallel with a capacitor C2, and the output impedance 114 includes a resistor R3 in parallel with a capacitor C3. The NDR device 104 is in parallel with the capacitor C4, and the NDR device 110 is in parallel with the capacitor C5.

Terminals of the resistor R1 and the capacitor C1 are coupled to a signal source 116. Terminals of the NDR device 104 and the capacitor C4 are coupled to a voltage bias source 118 (also shown as Vdd). Terminals of the NDR device 110 and the capacitor C5 are coupled to a voltage bias source 120 (also shown as Vss). Other terminals of the resistor R1 and the capacitor C1 are coupled to other terminals of the NDR device 104 and the capacitor C4. The other terminals of the NDR device 104 and the capacitor C4 are also coupled to terminals of the resistor R2 and the capacitor C2. Other terminals of the resistor R2 and the capacitor C2 are coupled to other terminals of the NDR device 110 and the capacitor C5. The other terminals of the NDR device 110 and the capacitor C5 are also coupled to terminals of the resistor R3 and the capacitor C3. Other terminals of the resistor R3 and the capacitor C3 provide an output signal of the neuristor 100.

In an example, each of the NDR devices 104 and 110 functions as current-controlled negative differential resistance (CCNDR) devices. In an example, the NDR devices 104 and 110 comprise metal-insulator-metal (MIM) devices that function as threshold switches, such as metal-oxide-metal structures formed on a substrate. Each of the NDR devices 104 and 110 has a threshold voltage. When the voltage across an NDR device reaches the threshold voltage, the NDR device effectively provides a negative resistance. A device that exhibits a "negative resistance" will experience a decrease in voltage with a rise in current at certain current levels. This is opposed to standard electric devices that always experience an increase in voltage with an increase in current. Due to the negative resistance, each of the NDR devices 104 and 110 will experience a decrease in voltage with the rising current over a particular range of current. Outside of this current range, the voltage across the NDR device will begin to increase and no longer operate as a negative resistance. Examples of NDR devices and their structures suitable for use in the neuristor 100 are described in commonly-assigned U.S. patent application Ser. No. 13/281,186, filed 25 Oct. 2011, which is incorporated by reference herein.

Figure 2:
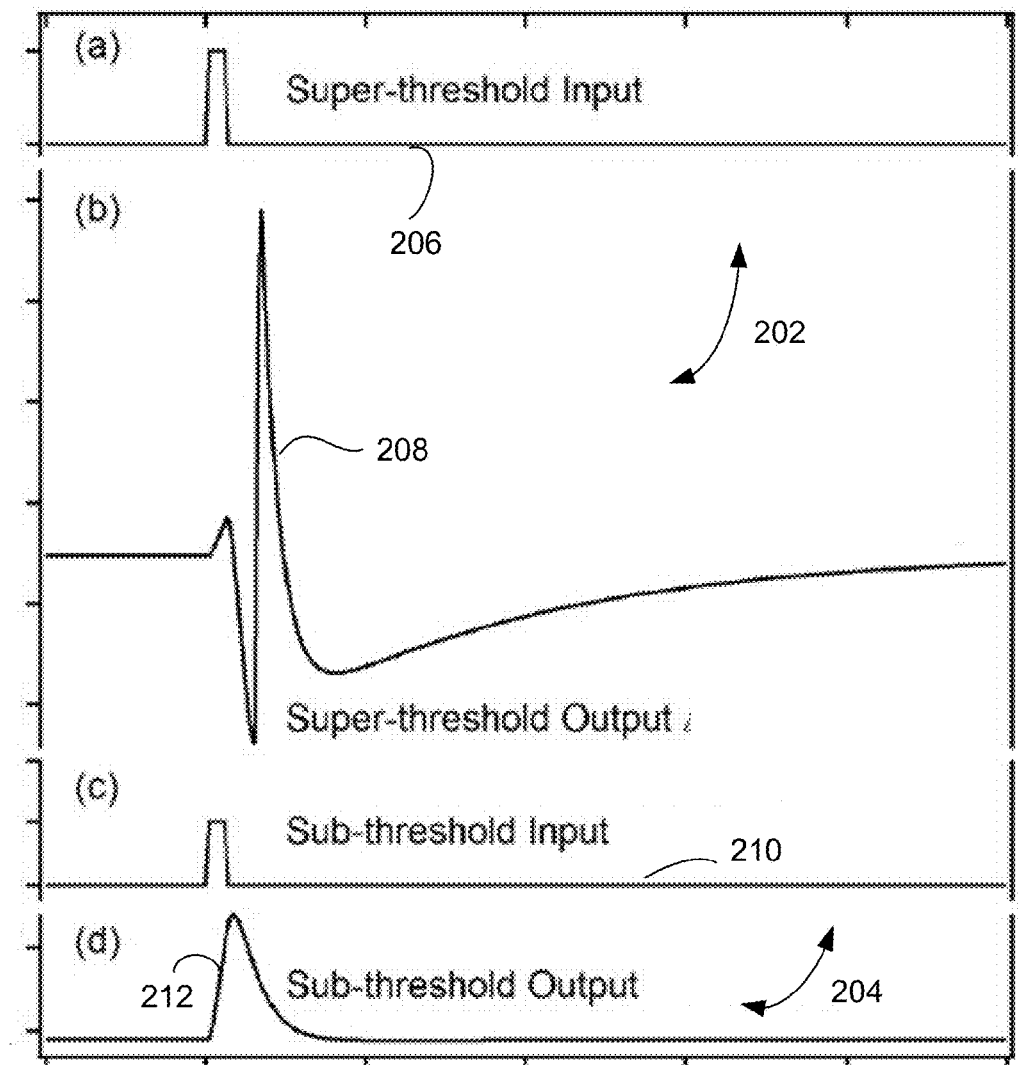
FIG. 2 is a graph showing voltage input and output curves of the neuristor of FIG. 1 for two scenarios according to an example implementation.

FIG. 2 is a graph 200 showing voltage input and output curves of the neuristor 100 for two scenarios 202 and 204 according to an example implementation. In the first scenario 202, the neuristor 100 is excited by a "super-threshold" voltage pulse, and in the second scenario 204 the neuristor 100 is excited by a "sub-threshold" voltage pulse. As will be described, the neuristor 100 has a voltage threshold such that if the input voltage is greater than the threshold, the output voltage spikes. If the input voltage is less than the threshold, the output voltage is attenuated.

Referring to FIGS. 1 and 2, consider a super-threshold voltage pulse applied by the signal source 116. In scenario 202, curve 206 shows the input voltage applied by the signal source 116, and curve 208 shows the output voltage at the output impedance 114. Before the input pulse, when each of the NDR devices 104 and 110 are energized by their respective bias voltages Vdd and Vss, the charge stored by the capacitors C4 and C5 is at a rest point. The output impedance 114 provides an output signal having a voltage between Vdd and Vss. This is the quiescent state of the neuristor 100. Each NDR device in conjunction with its parallel capacitor acts as a switchable dynamic conduction channel that can deliver power to the output impedance 114. The coupling impedance 108 acts to stabilize the neuristor 100 when it is inactive (i.e., no super-threshold voltage at the input). The RC output impedance 114 can act to capacitively couple signals to a load, such as another neuristor.

As the input pulse is applied through the input impedance 102, the capacitor C4 accumulates charge. At a certain threshold charge on the capacitor C4, the NDR device 104 transitions from an insulative state to a conductive state. The output impedance 114 begins to depolarize (i.e., the output voltage begins to drop). The capacitor C4 then discharges through the NDR device 104 until a threshold charge that causes the NDR device 104 to transition from a conductive state to an insulative state. When the NDR device 104 is fully insulating, the capacitor C4 begins charging back to its resting state.

As the output impedance 114 depolarizes as described above, the capacitor C5 accumulates charge. At a certain threshold charge, the NDR device 110 transitions from an insulative state to a conductive state. The output impedance 114 polarizes towards Vdd. The capacitor C5 then discharges through the NDR device 110 until a threshold charge that causes the NDR device 110 to transition from a conductive state to an insulative state. When the NDR device 110 is fully insulating, the capacitor C5 charges back to its resting state. The charge/trigger/discharge cycle of the NDR device 104 and the capacitor C4, followed by the overlapping charge/trigger/discharge cycle of the NDR device 110 and the capacitor C5 results in a voltage spike in the output, as shown by the curve 208.

Consider a sub-threshold voltage pulse applied by the signal source 116. In scenario 204, curve 210 shows the input voltage applied by the signal source 116, and curve 212 shows the output voltage at the output impedance 114. Before the input pulse, when each of the NDR devices 104 and 110 are energized by their respective bias voltages Vdd and Vss, the charge stored by the capacitors C4 and C5 is at a rest point. This is the quiescent state of the neuristor 100. As the input pulse is applied through the input impedance 102, the capacitor C4 accumulates charge. However, in the sub-threshold case, the capacitor C4 does not accumulate enough charge to trigger the NDR device 104. Likewise, the capacitor C5 does not accumulate enough charge to trigger the NDR device 110. Thus, the output voltage as shown by the curve 212 is attenuated and no voltage spike appears.

As seen from above, the neuristor 100 is a dynamic threshold spiking device. Logic design using neuristors can be based on the existence of a voltage spike (e.g., logic 1), or lack of voltage spike (e.g., logic 0), at a specific time. Note that neuristor-based logic cannot interpret static input and cannot latch a state. As shown below, the dynamic nature of neuristor-based logic relies on gate-to-gate synchrony through parallel logic pathways.

Figure 3:
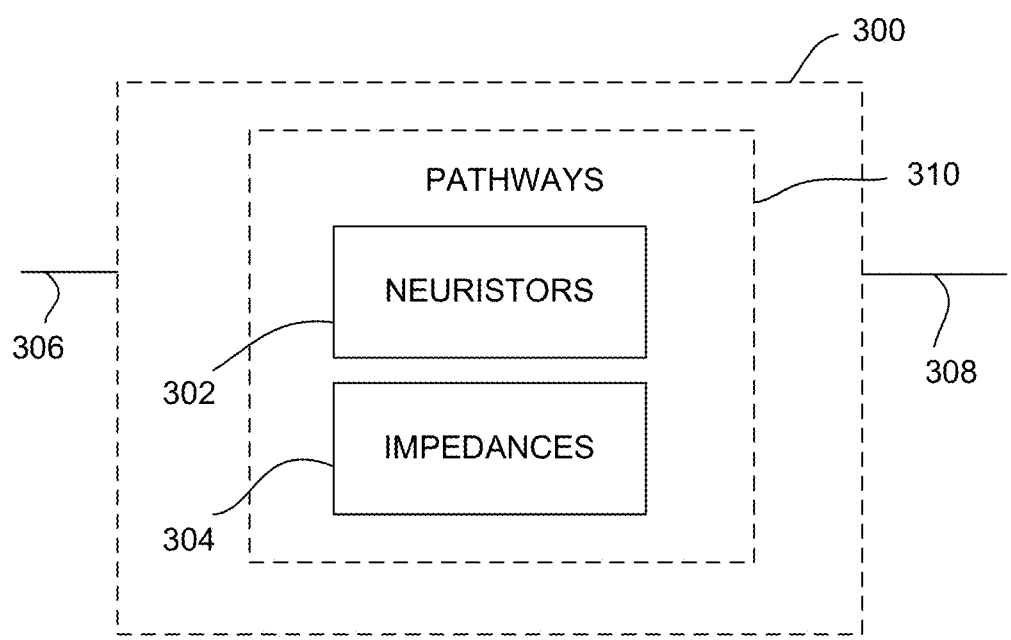
FIG. 3 is a block diagram of a logic circuit according to an example implementation.

FIG. 3 is a block diagram of a logic circuit 300 according to an example implementation. The logic circuit 300 includes a plurality of neuristors 302 and impedances 304. Each of the neuristors 302 includes a pair of NDR devices coupled by an impedance and biased with opposite polarities, and each of the neuristors 302 is in parallel with a capacitor. For example, each of the neuristors 302 can be constructed according to the neuristor 100 of FIG. 1. In general, a neuristor 302 produces a voltage spike output in response to a super-threshold input voltage, and an attenuated voltage output in response to a sub-threshold input voltage.

The impedances 304 couple the plurality of neuristors 302 to form input(s) 306 and output(s) 308. The output(s) 308 provide output signal(s) based on logical operation(s) of signal(s) coupled to the input(s) 306. Logical operations can include, for example, AND, OR, NAND, NOR, XOR, NOT, and like type operations. In an example, the neuristors 302 can be formed into pathways 310 coupled by the impedances 304. Each of the pathways 310 can selectively provide a voltage spike based on its input. The voltage spikes of some pathways can be combined and/or propagated to other pathways and so on to produce output signal(s) at the output(s) 308 in response to input signal(s) at the input(s) 306. In an example, at least some of the pathways can be parallel pathways. In an example, parallel pathways include the same number or neuristors to maintain propagation synchrony in the logic circuit.

Figure 4:
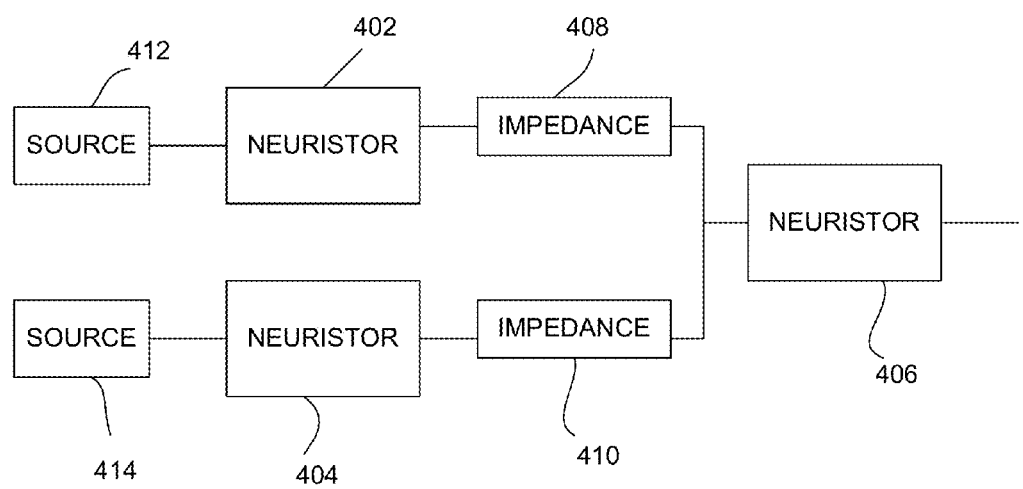
FIG. 4 is a circuit diagram of a logic gate according to an example implementation.

FIG. 4 is a circuit diagram of a logic gate 400 according to an example implementation. The logic gate 400 includes a neuristors 402, 404, and 406, and impedances 408 and 410. An output of the neuristor 402 is coupled to a terminal of the impedance 408. An output of the neuristor 404 is coupled to a terminal of the impedance 410. Other terminals of the impedances 408 and 410 are coupled to an input of the neuristor 406. Inputs of the neuristors 402 and 404 receive input signals from sources 412 and 414. An output of the neuristor 406 provides an output signal.

The neuristors 402 and 404 are part of parallel pathways in the logic gate 400. In an example, the impedances 408 and 410 can include equal value resistances. The logic operation performed by the logic gate 400 can be an AND operation or an OR operation depending on the resistance values of the impedances 408 and 410. In an example, each of the parallel pathways includes the same number or neuristors to maintain propagation synchrony.

In an example, the neuristors 402 and 404 are weakly-coupled to the neuristor 406 through the impedances 408 and 410. That is, the impedances 408 and 410 attenuate a voltage spike from any one of the neuristors 402 or 404 such that the voltage spike provides a sub-threshold input to the neuristor 406. If, however, voltage spikes from both of the neuristors 402 and 404 are coincident, then a combined super-threshold input is provided to the neuristor 406. Thus, in this configuration, the logic gate 400 provides an AND logic function. If the sources 412 and 414 provide coincident super-threshold inputs to the neuristors 402 and 404, the neuristors 402 and 404 will generate coincident voltage spikes. The coincident voltage spikes are combined and provided as a super-threshold input to the neuristor 406, which generates a voltage spike as output. In contrast, if only one of the sources 412 or 414, or if none of the sources 412 or 414, provide a super-threshold input, then only one or none of the neuristors 402 and 404 provide output voltage spikes. Due to the weak-coupling of the impedances 408 and 410, a single voltage spike (or no voltage spike) is not enough to trigger an output voltage spike of the neuristor 406.

In another example, the neuristors 402 and 404 are strongly-coupled to the neuristor 406 through the impedances 408 and 410. That is, the impedances 408 and 410 pass any one output voltage spike as a super-threshold input to the neuristor 406. Thus, in this configuration, the logic gate 400 provides an OR logic function. If at least one of the sources 412 or 414 provide a super-threshold input to the neuristors 402 and/or 404, the neuristors 402 and/or 404 will generate at least one voltage spike. One voltage spike is sufficient to provide a super-threshold input to the neuristor 406, which provides an output voltage spike. In contrast, if none the sources 412 and 414 provide a super-threshold input, then none of the neuristors 402 and 404 provide output voltage spikes. The neuristor 406 does not provide an output voltage spike in such case.

The circuit 400 of FIG. 4 is merely exemplary. It will be understood from the description herein that various logic circuits of different types can be constructed using neuristors and connecting impedances.

Figure 5:
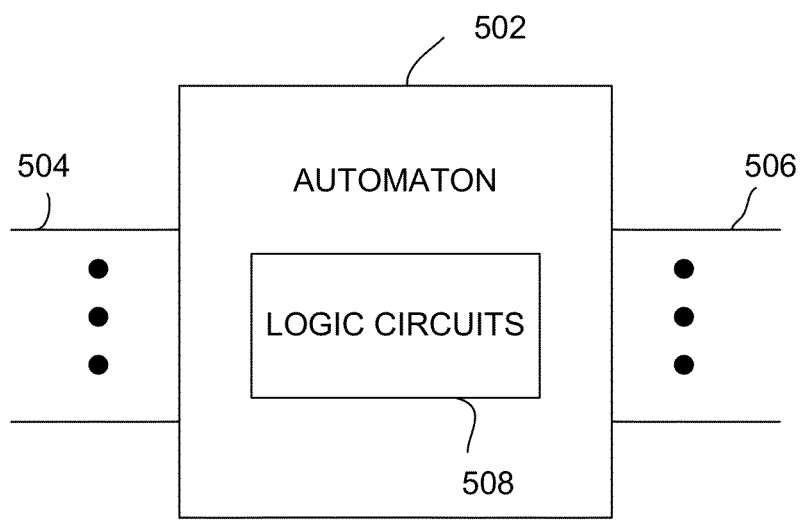
FIG. 5 is a block diagram showing a general computation system 500 according to an example implementation.

FIG. 5 is a block diagram showing a general computation system 500 according to an example implementation. The system 500 includes an automaton 502 having a plurality of inputs 504, a plurality of outputs 506, and a plurality of logic circuits 508 formed from neuristors (e.g., such as the logic circuit 300 of FIG. 3). The automaton 502 can operate to produce output signals on the plurality of outputs 506 given input signals on the plurality of inputs 504. The logic circuits 508 can be configured to perform desired computation operation(s) using the input signals on the inputs 504 to produce the output signals on the outputs 506. Each of the logic circuits 508 can include a plurality of neuristors, each of which produce an output voltage spike in response to a super-threshold input voltage, as described above. The neuristor-based logic circuits 508 can perform various logic operations, as described above, to facilitate operation of the automaton 502.

Logic circuits using neuristors have been described. In an example, a circuit includes a plurality of neuristors each producing an output voltage spike in response to a super-threshold input voltage. A plurality of impedances couple the plurality of neuristors to form at least one input and an output, the output selectively providing an output voltage spike based on a logical operation of at least one input voltage at the at least one input.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A circuit, comprising:
    a plurality of neuristors each producing an output voltage spike in response to a super-threshold input voltage; and
    a plurality of impedances coupling the plurality of neuristors to form at least one input and an output, the output selectively providing an output voltage spike based on a logical operation of at least one input voltage at the at least one input.

2. The circuit of claim 1, wherein the plurality of neuristors are formed into a plurality of pathways.

3. The circuit of claim 2, wherein at least a portion of the plurality of pathways are parallel.

4. The circuit of claim 3, wherein each parallel pathway in the plurality of pathways includes the same number of neuristors.

5. The circuit of claim 1, wherein the plurality of neuristors includes first, second, and third neuristors, wherein the plurality of impedances includes first and second impedances, and wherein the first neuristor is coupled to the third neuristor through the first impedance, and the second neuristor is coupled to the third neuristor through the second impedance.

6. The circuit of claim 5, wherein the first and second impedance include resistances having the same value.

7. A circuit, comprising:
    a plurality of neuristors, each of the plurality of neuristors having a pair of negative differential resistance (NDR) devices coupled by an impedance and biased with opposite polarities, each of the NDR devices being in parallel with a capacitor;
    a plurality of impedances coupling the plurality of neuristors to form at least one input and an output, the output providing an output signal based on a logical operation of at least one input signal at the at least one input.

8. The circuit of claim 7, wherein the plurality of neuristors are formed into a plurality of pathways.

9. The circuit of claim 8, wherein at least a portion of the plurality of pathways are parallel.

10. The circuit of claim 9, wherein each parallel pathway in the plurality of pathways includes the same number of neuristors.

11. The circuit of claim 7, wherein the plurality of impedances includes a first impedance to receive a first input signal, a second impedance to receive a second input signal, a third impedance, and a fourth impedance, and wherein the plurality of neuristors includes a first neuristor coupled between the first impedance and the second impedance, a second neuristor coupled between the second impedance and the fourth impedance, and a third neuristor coupled to the third and fourth impedances and providing the output.

12. The circuit of claim 11, wherein the third and fourth impedance include resistances having the same value.

13. A computation system, comprising:
    a plurality of inputs;
    a plurality of outputs;
    a plurality of logic circuits coupled between the plurality of inputs and the plurality of outputs, each of the plurality of logic circuits including:
        a plurality of neuristors each producing an output voltage spike in response to a super-threshold input voltage; and
        a plurality of impedances coupling the plurality of neuristors to form at least one input and an output, the output selectively providing an output voltage spike based on a logical operation of at least one input voltage at the at least one input.

14. The computation system of claim 11, wherein the plurality of neuristors in at least one of the logic circuits are formed into a plurality of pathways.

15. The computation system of claim 12, wherein at least a portion of the plurality of pathways in each said logic circuit are parallel.

* * * * *